US009435829B2

United States Patent
Hebiguchi et al.

(10) Patent No.: US 9,435,829 B2
(45) Date of Patent: Sep. 6, 2016

(54) CURRENT SENSOR

(71) Applicant: ALPS GREEN DEVICES CO., LTD., Tokyo (JP)

(72) Inventors: Hiroyuki Hebiguchi, Miyagi-ken (JP); Shinji Mitsuya, Miyagi-ken (JP); Manabu Tamura, Miyagi-ken (JP); Ryuji Mukaiyama, Miyagi-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 489 days.

(21) Appl. No.: 14/098,367

(22) Filed: Dec. 5, 2013

(65) Prior Publication Data
US 2014/0097826 A1 Apr. 10, 2014

Related U.S. Application Data

(63) Continuation of application No. PCT/JP2012/056644, filed on Mar. 15, 2012.

(30) Foreign Application Priority Data

Jul. 4, 2011 (JP) .................. 2011-148152

(51) Int. Cl.
*G01R 15/20* (2006.01)
*G01R 19/00* (2006.01)
G01B 7/06 (2006.01)
G01R 21/08 (2006.01)

(52) U.S. Cl.
CPC .............. *G01R 19/00* (2013.01); *G01R 15/20* (2013.01); *G01R 15/202* (2013.01); *G01R 15/207* (2013.01); *G01B 7/10* (2013.01); *G01R 21/08* (2013.01)

(58) Field of Classification Search
CPC .. G01R 15/20; G01R 15/202; G01R 15/207; G01R 19/00; G01B 7/10
See application file for complete search history.

(56) References Cited

U.S. PATENT DOCUMENTS

| 6,459,255 B1 | 10/2002 | Tamai et al. |
| 2010/0194381 A1 | 8/2010 | Ito et al. |
| 2014/0070801 A1* | 3/2014 | Tamura ................. G01R 15/20 324/244 |

FOREIGN PATENT DOCUMENTS

| JP | 2007-183221 | 7/2007 |
| JP | 2010-223722 | 10/2010 |
| JP | 2010-266290 | 11/2010 |

OTHER PUBLICATIONS

Search Report dated Jun. 12, 2012 from International Application No. PCT/JP2012/056644.

*Primary Examiner* — David Gray
*Assistant Examiner* — Michael Harrison
(74) *Attorney, Agent, or Firm* — Bayer Law Group LLP

(57) ABSTRACT

A current sensor includes first and second current paths each including a first conductive portion and second and third conductive portions extending in the X direction from both ends of the first conductive portion, and being neighboring and apart in the Y direction; and first and second magnetoelectric conversion elements arranged with the first conductive portion of the first current path interposed therebetween, and having sensitive axes along the Y direction. The second and third conductive portions of each of the first and second current paths are apart in the Z direction. The second conductive portion of the second current path is arranged in the Y direction with respect to the first and second magnetoelectric conversion elements. Perpendicular lines from the center line of the second conductive portion of the second current path to the first and second magnetoelectric conversion elements have the same direction and equivalent lengths.

8 Claims, 9 Drawing Sheets

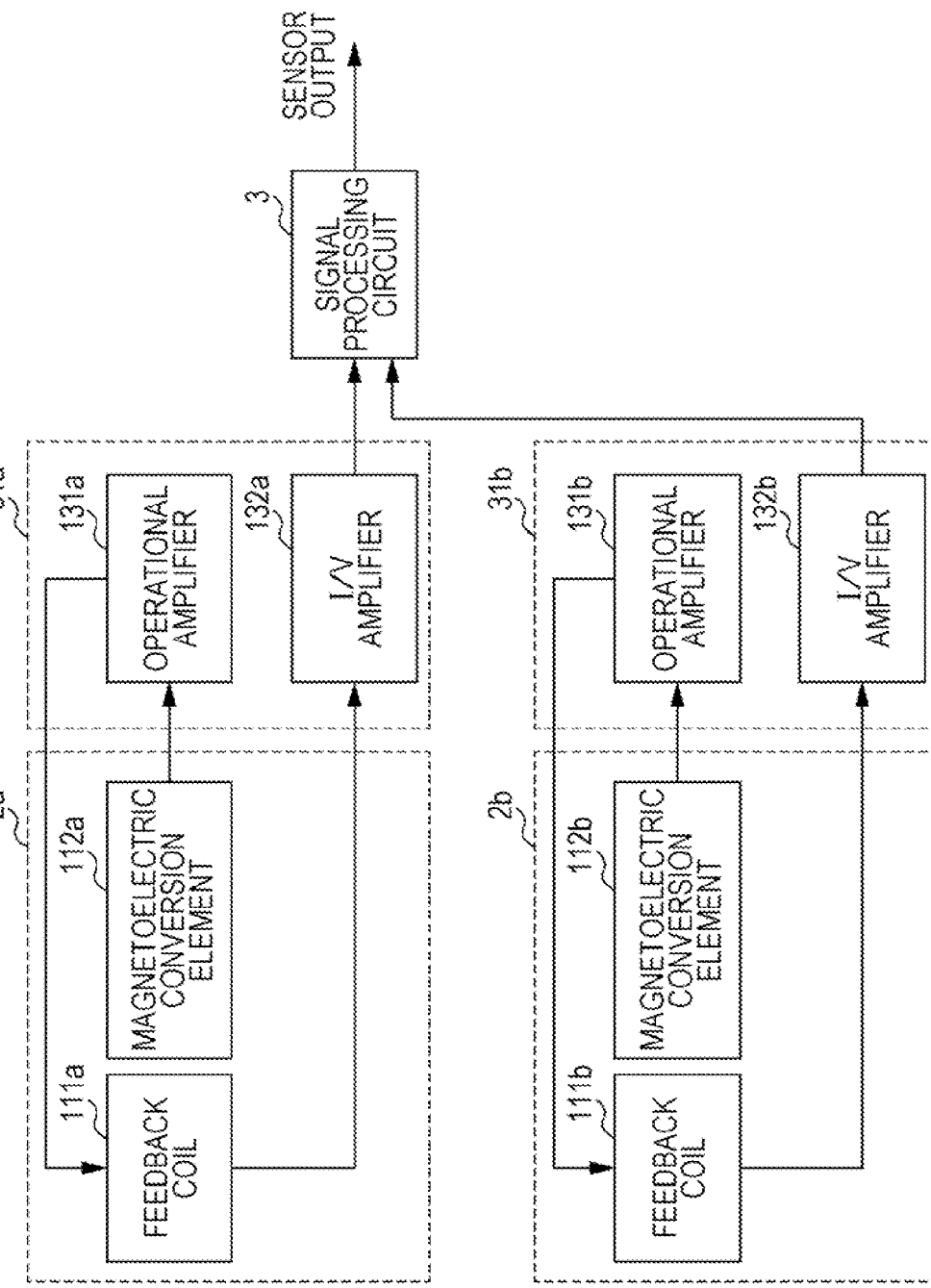

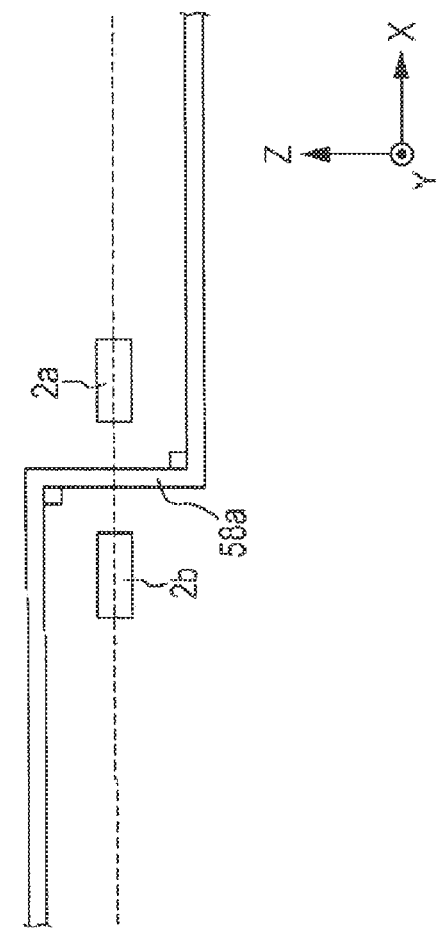
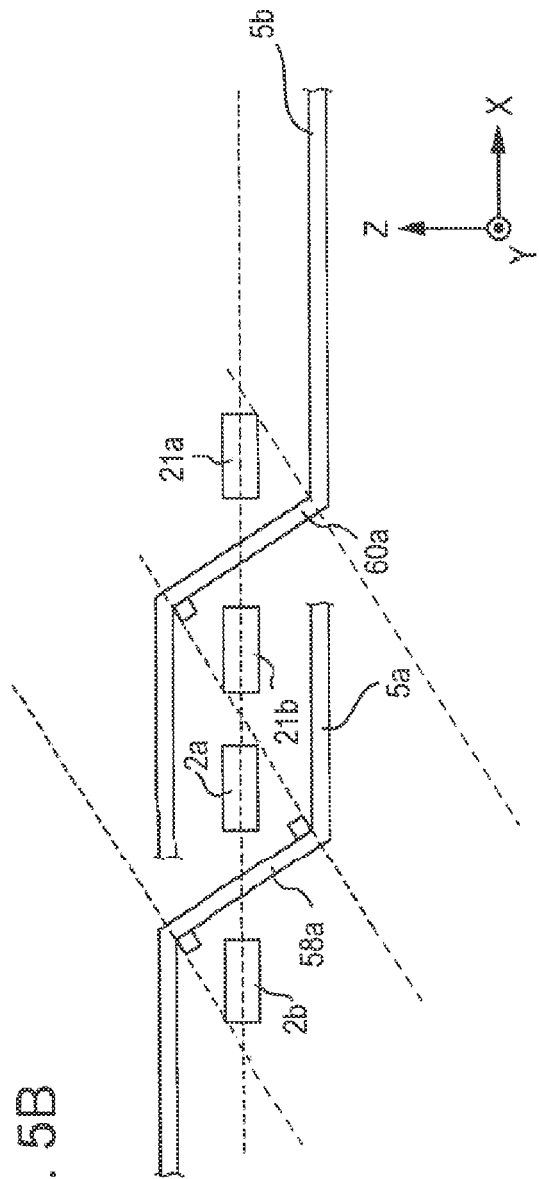

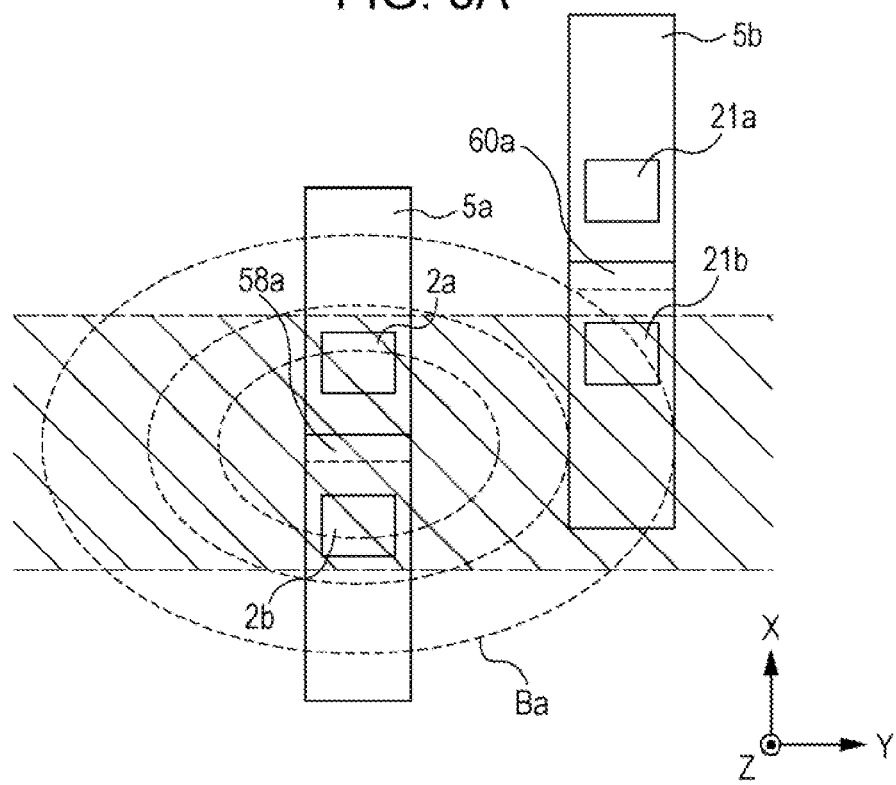
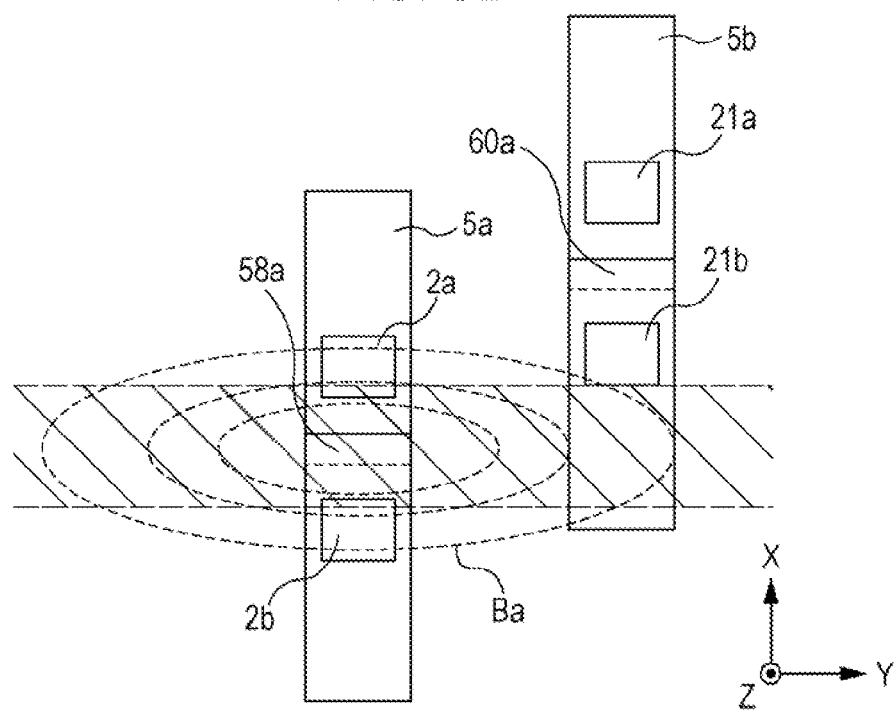

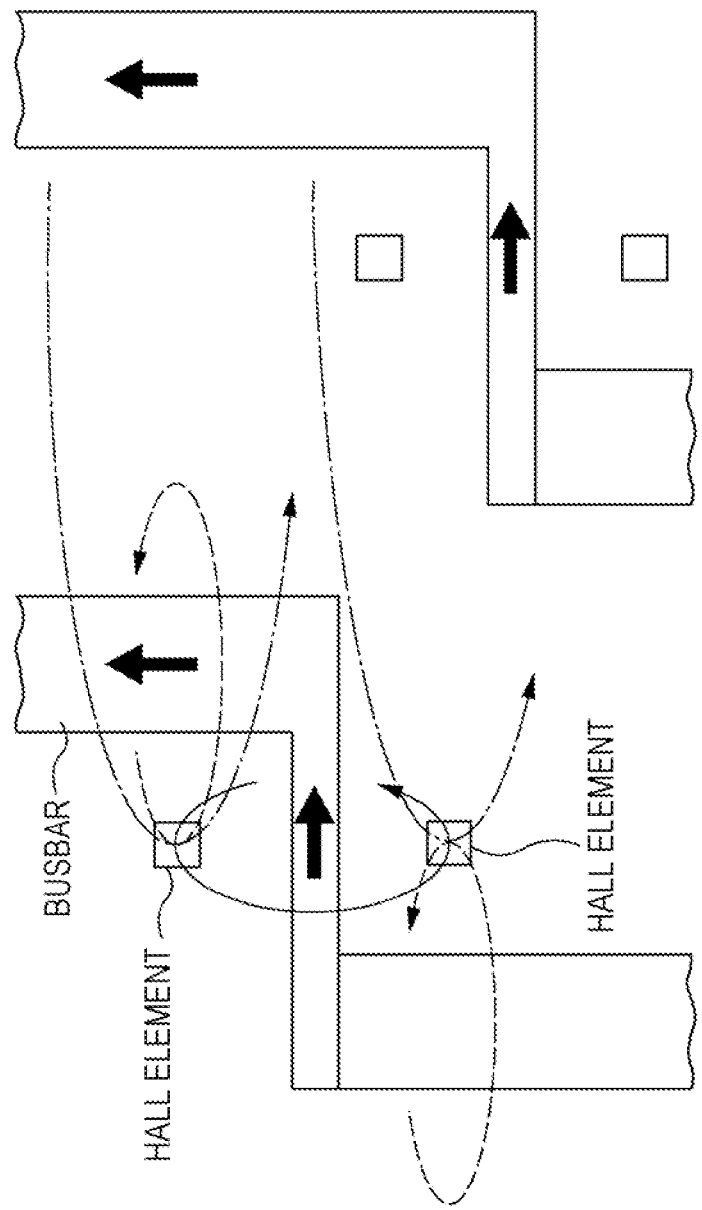

CURRENT SENSOR

CLAIM OF PRIORITY

This application is a Continuation of International Application No. PCT/JP2012/056644 filed on Mar. 15, 2012, which claims benefit of Japanese Patent Application No. 2011-148152 filed on Jul. 4, 2011. The entire contents of each application noted above are hereby incorporated by reference.

BACKGROUND OF THE INVENTION

1. Field of the Invention

The present invention relates to a current sensor that measures current flowing through a current path, based on a magnetic field near the current path.

2. Description of the Related Art

There is known as related art a current sensor that is arranged in a measurement-subject current path, measurement-subject current flowing through the measurement-subject current path, detects a magnetic field generated by the measurement-subject current flowing through the measurement-subject current path, and detects current flowing through the current path based on the detected magnetic field. Such a current sensor is mounted, for example, on a three-phase motor including three current paths arranged so that extending directions of the current paths are parallel to one another. The current sensor mounted on the three-phase motor has to restrict the effect of the magnetic field generated by the current flowing through a current path (a neighboring current path) provided next to the measurement-subject current path and prevent measurement accuracy for the measurement-subject current from being decreased. As a method of restricting the effect of the magnetic field caused by the neighboring current path, for example, there is suggested a current sensor illustrated in FIG. 10 that a pair of magnetoelectric conversion elements measure a magnetic field generated by measurement-subject current, and a magnetic field generated by current flowing through a neighboring current path is similarly applied to the magnetoelectric conversion elements. With this current sensor, the magnetic field generated by the measurement-subject current is applied to the pair of magnetoelectric conversion elements in the opposite directions, and the magnetic field generated by the neighboring current is applied to the pair of magnetoelectric conversion elements in the same direction. Hence, by using a difference between outputs of the pair of magnetoelectric conversion elements, the magnetic field generated by the neighboring current can be canceled. Also, an external magnetic field such as geomagnetism is applied to the pair of magnetoelectric conversion elements in the same direction, and hence the magnetic field can be canceled (for example, see Japanese Unexamined Patent Application Publication No. 2010-266290).

However, in the case of the current sensor disclosed in Japanese Unexamined Patent Application Publication No. 2010-266290, the magnetic field generated by the current flowing through the neighboring current path is superposed on the magnetic field generated by the current flowing through the measurement-subject current path in the same direction. Therefore, each of the magnetoelectric conversion elements should be able to measure the magnetic field having a strength with both magnetic fields added. Accordingly, the dynamic range is decreased by the amount corresponding to the strength of the magnetic field generated by the current flowing through the neighboring path.

SUMMARY OF THE INVENTION

The present invention provides a current sensor that can reduce the effects of both an external magnetic field such as geomagnetism and a magnetic field of a neighboring current path, and prevent the dynamic range from being decreased.

A current sensor according to an aspect of the invention includes a first current path serving as a measurement-subject current path; a second current path provided next to the measurement-subject current path; and first and second magnetoelectric conversion elements arranged with the first current path interposed therebetween. The first and second current paths each include a first conductive portion, and second and third conductive portions extending in an X direction from both ends of the first conductive portion. The first and second current paths are neighboring and apart in a Y direction that is orthogonal to the X direction. The second and third conductive portions of the first current path are apart in a Z direction that is orthogonal to the X and Y directions, and positions in the Y direction of the second and third conductive portions of the first current path are aligned with each other. The second and third conductive portions of the second current path are apart in the Z direction, and positions in the Y direction of the second and third conductive portions of the second current path are aligned with each other. The first and second magnetoelectric conversion elements are arranged with the first conductive portion of the first current path interposed therebetween. Directions of sensitive axes of the first and second magnetoelectric conversion elements are the Y direction. The second conductive portion of the second current path is arranged in the Y direction with respect to the first and second magnetoelectric conversion elements. A perpendicular line from the center line of the second conductive portion of the second current path to the first magnetoelectric conversion element and a perpendicular line from the center line of the second conductive portion of the second current path to the second magnetoelectric conversion element have the same direction and equivalent lengths.

With this current sensor, the direction of the magnetic field generated by the current flowing through the second conductive portion of the second current path can be an angle substantially orthogonal to the sensitive axes of the first and second magnetoelectric conversion elements. Also, the magnetic field generated by the current flowing through the second conductive portion of the second current path is almost not measured by the first and second magnetoelectric conversion elements. Accordingly, the dynamic range can be prevented from being decreased. If the positions in the Z direction (the height direction) of the second conductive portions of both the first and second current paths are aligned with each other and cannot be obliquely arranged on the ZY coordinate, the direction of the magnetic field generated by the current flowing through the second conductive portion of the second current path is not orthogonal to the sensitive axes of the first and second magnetoelectric conversion elements. Therefore, measurement is made by the first and second magnetoelectric conversion elements although the magnitude of current is very small. However, since the magnitude of current is very small, the decrease in dynamic range can be also reduced.

Also, the magnetic field generated by the current flowing through the second conductive portion of the second current path gives the same effect to the first and second magnetoelectric conversion elements. Accordingly, by using the difference between the outputs of the first and second magnetoelectric conversion elements, the effect of the magnetic field generated by the current flowing through the second conductive portion of the second current path can be removed. Also, the positions in the Y direction of the first to third conductive portions of each current path are aligned. That is, the first to third conductive portions are arranged on a line when viewed in the Z direction. Accordingly, an increase in size in the Y direction (the lateral direction) can be prevented.

If the first or second magnetoelectric conversion element is present at a position orthogonal to the current flowing through the first conductive portion of the second current path, the magnetic field generated by the current flowing through the first conductive portion of the second current path gives different effects to the first and second magnetoelectric conversion elements. However, if the current path extends long in the X direction (the depth direction), measurement accuracy can be prevented from being decreased by sufficiently separating the position of the first conductive portion of the second current path from the first or second magnetoelectric conversion element. That is, comparing with Japanese Unexamined Patent Application Publication No. 2010-266290, the length is increased in the X direction (the depth direction); however, the size in the Y direction (the lateral direction) can be decreased. Also, the dynamic range can be prevented from being decreased. The X direction (the depth direction) mentioned here is a direction in which current flows through the second and third conductive portions. Similarly, the Y direction (the lateral direction) is a direction in which a plurality of current paths are arranged. The Z direction (the height direction) is a direction orthogonal to the X and Y directions. During use, the X direction (the depth direction) and the Y direction (the lateral direction) do not have to be the horizontal direction. Similarly, the Z direction (the height direction) does not have to be the vertical direction.

Also, in the current sensor of the aspect, the first and second conductive portions may form the right angle, and the first and third conductive portions may form the right angle.

Also, in the current sensor of the aspect, the first and second magnetoelectric conversion elements may be arranged outside a region along a normal to a plane extending in the Y direction from the first conductive portion of the second current path.

Also, in the current sensor of the aspect, the second conductive portion of the first current path, the third conductive portion of the first current path, the second conductive portion of the second current path, and the third conductive portion of the second current path may be parallel to one another. The first and second conductive portions of each of the current paths may form an angle other than the right angle. The first and third conductive portions of each of the current paths may form an angle other than the right angle.

Also, in the current sensor of the aspect, fourth and fifth conductive portions may be connected to the second conductive portion of the first current path, and sixth and seventh conductive portions are connected to the third conductive portion of the first current path. The seventh conductive portion may be provided on an extension of the fifth conductive portion. With this current sensor, since the start point and the end point of each current path are arranged on a line, the current sensor is easily assembled with upstream or downstream equipment.

Also, in the current sensor of the aspect, the first conductive portion of the first current path may have a larger length in the Y direction than a length in the X direction. The second and third conductive portions of the first current path may each have a larger length in the Y direction than a length in the Z direction. With this current sensor, the direction of the magnetic field generated by the current flowing through the first current path is linear at the portion of the first and second magnetoelectric conversion elements. Accordingly, the measurement accuracy can be increased.

Also, in the current sensor of the aspect, the first and second magnetoelectric conversion elements may be mounted on a substrate. The substrate may have a first slit between the first and second magnetoelectric conversion elements, and the first conductive portion of the first current path may be arranged at the first slit. With this current sensor, the first and second magnetoelectric conversion elements are easily attached to the first current path.

Also, in the current sensor of the aspect, third and fourth magnetoelectric conversion elements may be provided with the first conductive portion of the second current path interposed therebetween. The third and fourth magnetoelectric conversion elements may be mounted on a substrate. The substrate may have a second slit between the third and fourth magnetoelectric conversion elements, and the first conductive portion of the second current path is arranged at the second slit. With this current sensor, magnetoelectric conversion elements are easily attached to a plurality of current paths.

With the aspect of the invention, the effects of both an external magnetic field such as geomagnetism and a magnetic field of a neighboring current path can be reduced, and the dynamic range can be prevented from being decreased.

BRIEF DESCRIPTION OF THE DRAWINGS

FIG. 3 is a block diagram illustrating a configuration example of the current sensor;

FIGS. 5A and 5B are schematic views each illustrating a configuration example of a bent portion of the current sensor;

FIGS. 6A and 6B are schematic views each illustrating a magnetic field generated at the bent portion;

FIG. 10 is a plan view of a current sensor of related art.

DESCRIPTION OF THE PREFERRED EMBODIMENTS

Figure 1:
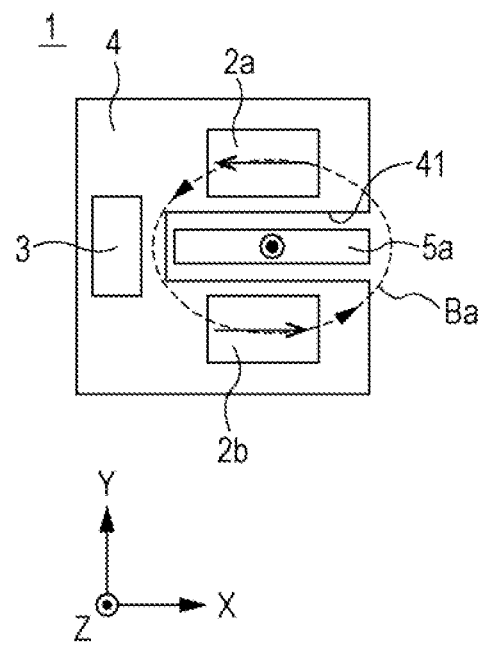
FIG. 1 illustrates a measurement principle of a current sensor.

FIG. 1 illustrates a measurement principle of a current sensor. FIG. 1 is a plan view for a printed circuit board 4 (described later), and is a sectional view for a current path 5*a*. Referring to FIG. 1, a current sensor 1 extends from one side edge toward the center (in the X direction in FIG. 1), and includes the printed circuit board 4 having a slit 41. The measurement-subject current path 5*a* is inserted through the slit 41. Magnetoelectric conversion elements 2a and 2b and a signal processing circuit 3 are mounted on a surface of the printed circuit board 4. The magnetoelectric conversion elements 2a and 2b are arranged at equivalent distances from the measurement-subject current path 5a while the slit 41 is interposed therebetween in the up-down direction of the figure (in the Y direction in FIG. 1).

The measurement-subject current path 5a is formed of a flat-plate conductor that a conductive member such as copper is formed in a strip shape with a substantially constant width and a substantially constant thickness. The measurement-subject current path 5a is inserted through the slit 41 of the printed circuit board 4 orthogonally to the plane direction of the printed circuit board 4. That is, the measurement-subject current path 5a is arranged so that the front surface faces the upper side (in the Y direction in FIG. 1), and the measurement-subject current path 5a extends from the near side to the far side of the figure (in the Z direction in FIG. 1). Measurement-subject current flows from the far side to the near side of the figure.

The magnetoelectric conversion elements 2a and 2b each have a substantially rectangular shape, and each have a sensitive axis in a direction (the X direction in FIG. 1) perpendicular to a direction (a flowing direction) in which the current flows through the measurement-subject current path 5a. Also, the magnetoelectric conversion elements 2a and 2b are arranged so that the sensitive axes are oriented in mutually opposite directions. The magnetoelectric conversion elements 2a and 2b are not particularly limited as long as the elements can detect magnetism. For example, a magnetic sensor using a magnetoresistive element, such as a giant magneto resistance (GMR) element or a tunnel magneto resistance (TMR) element, or a magnetic sensor using a hall element may be applied to the magnetoelectric conversion elements 2a and 2b.

Figure 2:
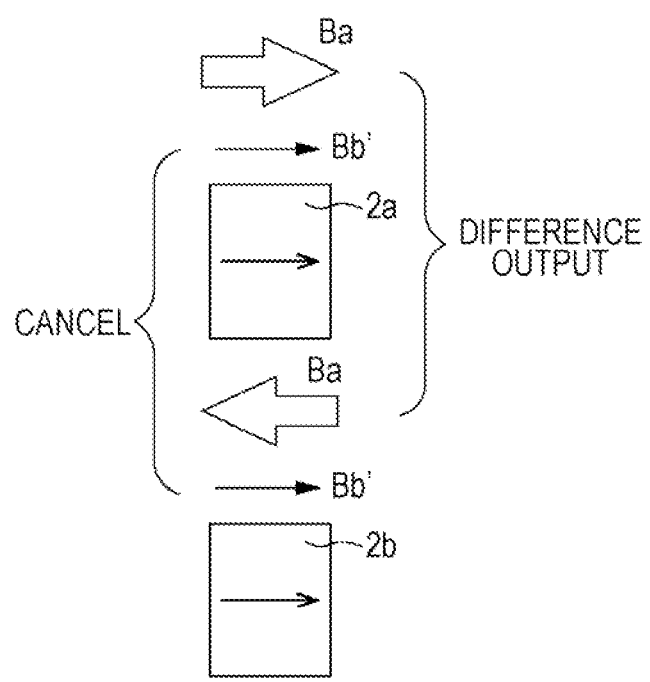
FIG. 2 illustrates a configuration example of the current sensor.

FIG. 2 is an illustration explaining a magnetic field applied to the magnetoelectric conversion elements 2a and 2b. In FIG. 2, arrows on the magnetoelectric conversion elements 2a and 2b indicate the sensitive-axis directions of the respective magnetoelectric conversion elements, white arrows indicate the magnetic field generated by the current (the measurement-subject current) flowing through the measurement-subject current path 5a, and thin-line arrows indicate an external magnetic field.

An external magnetic field Bb' is applied to the magnetoelectric conversion elements 2a and 2b with the same strength in the same direction. That is, the external magnetic field Bb' is applied to the magnetoelectric conversion elements 2a and 2b with the same vector. In contrast, an induced magnetic field Ba generated by the current flowing through the measurement-subject current path 5a is applied to the magnetoelectric conversion elements 2a and 2b with the same strength in the opposite directions. Hence, if the signal processing circuit 3 executes differential operation processing, the effect of the external magnetic field Bb' can be canceled, and a difference output of the induced magnetic field Ba can be obtained. The amount of current in the measurement-subject current path 5a can be calculated on the basis of the difference output of the induced magnetic field Ba.

FIG. 3 is a block diagram illustrating a configuration example of the current sensor 1 including the magnetoelectric conversion elements 2a and 2b. Referring to FIG. 3, the current sensor 1 includes control circuit elements 31a and 31b that control the magnetoelectric conversion elements 2a and 2b, and a signal processing circuit 3 that obtains a difference between outputs of the control circuit elements 31a and 31b and outputs the difference as a sensor output, in addition to the magnetoelectric conversion elements 2a and 2b.

Referring to FIG. 3, the magnetoelectric conversion elements 2a and 2b include feedback coils 111a and 111b arranged so that the feedback coils 111a and 111b can generate a magnetic field in a direction in which the magnetic field cancels the induced magnetic field Ba generated by measurement-subject current I, and magnetoelectric conversion elements 112a and 112b.

Also, the control circuit elements 31a and 31b include operational amplifiers 131a and 131b that amplify differential outputs of the magnetoelectric conversion elements 112a and 112b and control feedback current of the feedback coils 111a and 111b, and I/V amplifiers 132a and 132b that convert the feedback current into voltage.

The feedback coils 111a and 111b are arranged near the magnetoelectric conversion elements 112a and 112b, and generate a cancel magnetic field that cancels the induced magnetic field Ba generated by the measurement-subject current I. For example, if the magnetoelectric conversion elements 112a and 112b are formed by using magnetoresistive elements each having a characteristic that a resistance value is changed by an induced magnetic field from measurement-subject current, the current sensor 1 with high sensitivity can be provided.

The signal processing circuit 3 obtains the difference between output voltages from the control circuit elements 31a and 31b (that is, output voltages from the I/V amplifiers 132a and 132b) and outputs the difference. The signal processing circuit 3 is formed of, for example, a differential amplifier. With this differential operation processing, the effect of an external magnetic field such as geomagnetism is canceled, and current can be measured with high accuracy.

The configuration of the current sensor 1 is not limited to the above-described configuration. For example, a magnetic proportional sensor not using a feedback coil or the like may be used for the magnetoelectric conversion elements 2a and 2b. Also, a magnetosensitive element such as a hall element may be used other than the above-described magnetoresistive element.

A configuration example of the current sensor according to this embodiment of the invention is described below in detail. The current sensor has a configuration that the external magnetic field Bb' is applied to the magnetoelectric conversion elements 2a and 2b with the same vector and the induced magnetic field Ba generated by the current flowing through the measurement-subject current path 5a is applied to the magnetoelectric conversion elements 2a and 2b with the different vectors.

FIRST CONFIGURATION EXAMPLE

Figure 4A:
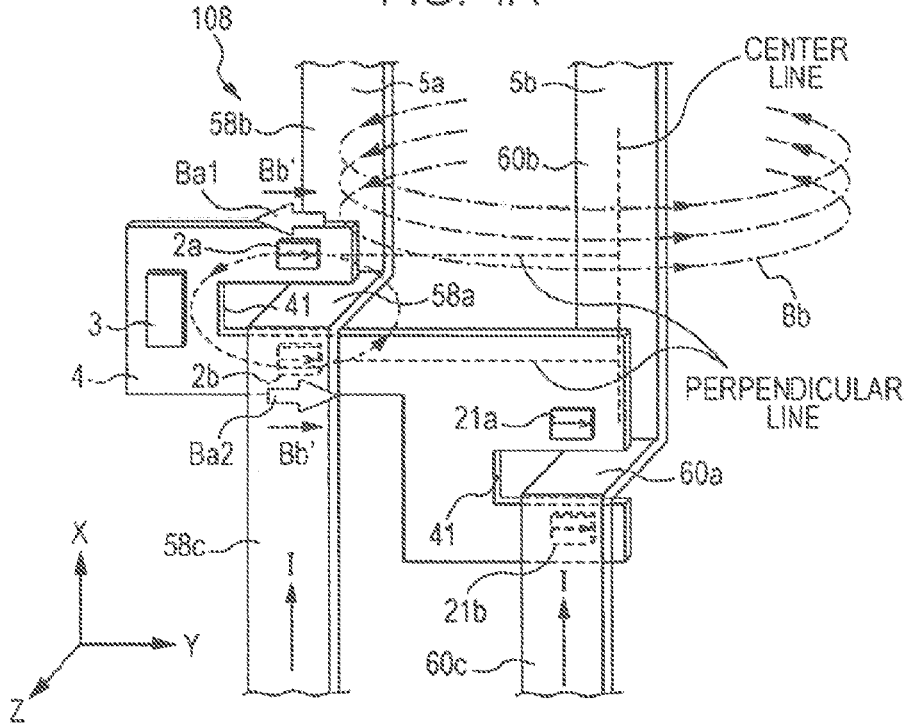
FIGS. 4A and 4B illustrate a first configuration example of a current sensor.

FIG. 4A illustrates a configuration example of a current sensor according to the embodiment. Referring to FIG. 4A, in a current sensor 108, a measurement-subject current path 5a and a neighboring current path 5b are provided to extend in the X direction in FIG. 4A in parallel to each other. Measurement-subject current flows through the measurement-subject current path 5a, and neighboring current flows through the neighboring current path 5b. Hence, the extending directions of the current paths 5a and 5b are the flowing directions. That is, the current path 5a extends in the flowing direction (a first direction), and the current path 5b is arranged next to the current path 5a in substantially parallel to the extending direction of the current path 5a.

A portion of the measurement-subject current path 5a is bent, and a bent first conductive portion 58a is formed. To be specific, the first conductive portion 58a is bent in a direction orthogonal to a direction (the Y direction) along the width of the current path (a direction along the length of the current path in a direction orthogonal to the flowing direction on the mount surface of the magnetoelectric conversion element 2a, 2b). The surface of the first conductive portion 58a is oriented, for example, in a direction orthogonal to the flowing direction.

Hence, the current path 5a is formed such that a second conductive portion 58b and a third conductive portion 58c extend in the X direction from both ends of the first conductive portion 58a and are connected at both the ends. Also, the second conductive portion 58b is apart from the third conductive portion 58c in the Z direction that is orthogonal to the X and Y directions. The positions in the Y direction of the second conductive portion 58b and the third conductive portion 58c are aligned with each other. That is, in the measurement-subject current path 5a, the measurement-subject current flows in the X direction in FIG. 4A at the second and third conductive portions 58b and 58c, and the measurement-subject current flows in the Z direction in FIG. 4A at the first conductive portion 58a.

The neighboring current path 5b is arranged next to the measurement-subject current path 5a and is apart from the measurement-subject current path 5a in the Y direction that is orthogonal to the X direction. Similarly to the measurement-subject current path 5a, a portion of the neighboring current path 5b is bent, and hence a bent first conductive portion 60a is formed. The surface of the first conductive portion 60a is oriented, for example, in a direction orthogonal to the flowing direction. Hence, the current path 5b is formed such that a second conductive portion 60b and a third conductive portion 60c extend in the X direction from both ends of the first conductive portion 60a and are connected at both the ends. Also, the second conductive portion 60b is apart from the third conductive portion 60c in the Z direction that is orthogonal to the X and Y directions. The positions in the Y direction of the second and third conductive portions 60b and 60c are aligned with each other. That is, also in the neighboring current path 5b, the neighboring current flows in the X direction in FIG. 4A at the second and third conductive portions 60b and 60c, and the neighboring current flows in the Z direction in FIG. 4A at the first conductive portion 60a.

Magnetoelectric conversion elements 2a and 2b and a signal processing circuit 3 are mounted on a surface of a printed circuit board 4. The magnetoelectric conversion elements 2a and 2b are arranged with the first conductive portion 58a of the measurement-subject current path 5a interposed therebetween. The direction of the sensitive axes of the magnetoelectric conversion elements 2a and 2b is the Y direction. The second conductive portion 60b of the neighboring current path 5b is arranged in the Y direction with respect to the magnetoelectric conversion elements 2a and 2b. The second conductive portion 60b is arranged so that the perpendicular line extending from the center line of the second conductive portion 60b of the neighboring current path 5b to the magnetoelectric conversion element 2a and the perpendicular line extending from the center line to the magnetoelectric conversion element 2b have substantially the same directions and substantially equivalent lengths.

To be specific, the printed circuit board 4 has two slits 41 penetrating therethrough from the near side to the far side of the figure (in the Z direction in FIG. 4A). The printed circuit board 4 is arranged so that the first conductive portion 58a of the measurement-subject current path 5a passes through one of the slits 41. Accordingly, the magnetoelectric conversion elements 2a and 2b are arranged at substantially equivalent distances from the measurement-subject current path 5a with the slit 41 interposed therebetween. Similarly, the printed circuit board 4 is arranged so that the first conductive portion 60a of the neighboring current path 5b passes through the other of the slits 41 of the printed circuit board 4. Accordingly, magnetoelectric conversion elements 21a and 21b are arranged at substantially equivalent distances from the neighboring current path 5b with the slit 41 interposed therebetween.

The magnetoelectric conversion elements 2a and 2b are arranged so that the sensitive axes are perpendicular to the flowing direction and the sensitive axes are oriented in the same direction. In FIG. 4A, arrows on the magnetoelectric conversion elements 2a and 2b indicate sensitive-axis directions of the respective magnetoelectric conversion elements. The sensitive-axis directions represent directions in which the magnetoelectric conversion elements 2a and 2b obtain maximum sensitivities. FIG. 4A illustrates a case where the sensitive axes of the magnetoelectric conversion elements 2a and 2b are oriented rightward of the figure; however, the sensitive axes may be arranged to be oriented in the inverted direction (leftward of the figure). Also, the sensitive axes of the magnetoelectric conversion elements 2a and 2b may be oriented in the mutually opposite directions. For example, the sensitive axis of the magnetoelectric conversion element 2a may be oriented rightward and the sensitive axis of the magnetoelectric conversion element 2b may be oriented leftward. Also, when a hall element is applied as a magnetoelectric conversion element, the sensitive axis is oriented in a direction orthogonal to a magnetosensitive plane (for example, in the Z direction in FIG. 4A). Also, the first conductive portions 58a and 60a are formed at positions so as not to overlap each other.

Also, the first conductive portion 58a of the measurement-subject current path 5a may have a larger length in the Y direction than a length in the X direction. The second and third conductive portions 58b and 58c may have larger lengths in the Y direction than lengths in the Z direction.

Figure 4B:
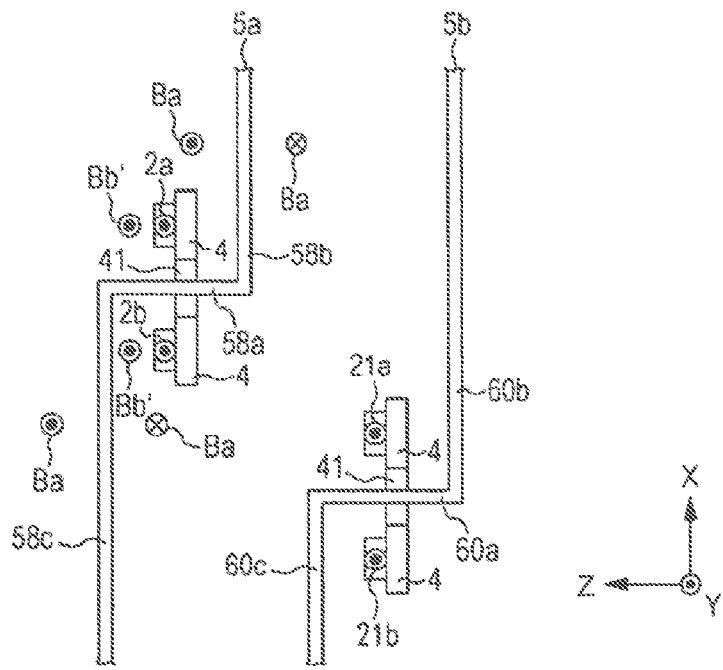

With the current sensor 108 with this configuration, a case is considered such that current flows through the measurement-subject current path 5a and the neighboring current path 5b. In FIG. 4B, it is assumed that current I flows upward of the figure (in the X direction in FIG. 4A). The direction of an induced magnetic field Ba generated by current flowing through the first conductive portion 58a of the measurement-subject current path 5a near the magnetoelectric conversion element 2a is opposite to that near the magnetoelectric conversion element 2b. Hence, an induced magnetic field Ba1 detected by the magnetoelectric conversion element 2a and an induced magnetic field Ba2 detected by the magnetoelectric conversion element 2b have the same strength and different directions. That is, the magnetic field generated by the current flowing through the measurement-subject current path 5a is applied with different vectors to the magnetoelectric conversion elements 2a and 2b.

In contrast, a magnetic field Bb is generated near the measurement-subject current path 5a by the current flowing through the neighboring current path 5b. A portion of the neighboring current path 5b next to the magnetoelectric conversion elements 2a and 2b is a straight region without the first conductive portion 60a. The perpendicular line extending from the center line of the neighboring current path 5b to the magnetoelectric conversion element 2a and the perpendicular line extending from the center line to the magnetoelectric conversion element 2b have substantially the same directions and substantially equivalent lengths. A segment connecting the magnetoelectric conversion element 2a with the magnetoelectric conversion element 2b is substantially parallel to a straight portion of the neighboring current path 5b arranged next to the segment. A portion of the neighboring current path 5b arranged next to the magnetoelectric conversion element 2a and a portion of the neighboring current path 5b arranged next to the magnetoelectric conversion element 2b have substantially the same sectional areas. Accordingly, a magnetic field Bb' detected by the magnetoelectric conversion element 2a and a magnetic field Bb' detected by the magnetoelectric conversion element 2b have the same direction and the same strength. That is, the magnetic field generated by the current flowing through the neighboring current path 5b is applied with the same vector to the magnetoelectric conversion elements 2a and 2b. Also, geomagnetism is applied to the magnetoelectric conversion elements 2a and 2b with the same vector.

Hence, if the signal processing circuit 3 executes the differential operation processing for the magnetic field detected by the magnetoelectric conversion elements 2a and 2b, the effect of the external magnetic field with the same vector amount (the magnetic field Bb by the neighboring current path 5b and geomagnetism) is canceled, and only the induced magnetic field Ba by the measurement-subject current path 5a with the different vector amount is output as the difference. The current flowing through the measurement-subject current path 5a can be detected with high accuracy based on the induced magnetic field Ba output in this way.

As described above, in the current sensor 108, the magnetoelectric conversion elements 2a and 2b are arranged at both sides with the measurement-subject current path 5a interposed therebetween. Accordingly, the induced magnetic field Ba generated by the current flowing through the measurement-subject current path 5a is applied to the magnetoelectric conversion elements 2a and 2b with the different vectors, and the external magnetic field is applied to the magnetoelectric conversion elements 2a and 2b with the same vector. In this case, since the induced magnetic field generated at the measurement-subject current path 5a is applied to the magnetoelectric conversion elements 2a and 2b with the exactly opposite vectors, the difference output value can be increased, and the detection accuracy for the measurement-subject current can be increased. Also, the magnetic field generated by the current flowing through the second conductive portion 60b of the neighboring current path 5b is almost not measured by the magnetoelectric conversion elements 2a and 2b. Accordingly, the dynamic range can be prevented from being decreased. Also, as illustrated in FIGS. 4A and 4B, since the bent first conductive portion is provided at the measurement-subject current path 5a and the neighboring current path 5b is arranged, the size in the width direction of the current path can be decreased.

Each of the first conductive portions 58a and 60a may be perpendicular to the flowing direction, or may be provided at an angle (obliquely) to the flowing direction. FIGS. 5A and 5B are schematic illustrations of the measurement-subject current path 5a of the current sensor 108 when viewed from a side surface. The measurement-subject current path 5a illustrated in FIG. 5A has a first conductive portion 58a perpendicular to the flowing direction. A measurement-subject current path 5a illustrated in FIG. 5B has a first conductive portion 58a oblique to the flowing direction.

FIGS. 6A and 6B are schematic views illustrating an induced magnetic field Ba generated by the current flowing through the first conductive portion 58a of the measurement-subject current path 5a illustrated in FIGS. 5A and 5B, respectively. The measurement-subject current path 5a illustrated in FIGS. 6A and 6B corresponds to the measurement-subject current path 5a illustrated in FIGS. 5A and 5B, respectively. In each of FIGS. 6A and 6B, a portion with hatching is an area that receives the effects of the induced magnetic field Ba generated by the current flowing through the first conductive portion 58a. When the first conductive portion 58a is provided at an angle (obliquely) to the direction perpendicular to the flowing direction (so as to form a non-orthogonal region) (see FIGS. 5B and 6B), the range that is affected by the induced magnetic field Ba from the first conductive portion 58a of the measurement-subject current path 5a is limited. Similarly, when the first conductive portion 60a of the neighboring current path 5b is provided at an angle (obliquely) to the direction perpendicular to the flowing direction as shown in FIG. 5B, the range that is affected by an induced magnetic field from the first conductive portion 60a of the neighboring current path 5b is limited. Accordingly, if the first conductive portion 58a and the first conductive portion 60a are obliquely provided and the non-orthogonal regions are formed, as shown in FIG. 5B, the magnetoelectric conversion elements 21a and 21b are hardly affected by the induced magnetic field generated by the current flowing through the first conductive portion 58a of the first current path 5a, and the magneto electric conversion elements 2a and 2b are also hardly affected by the induced magnetic field generated by the current flowing through the first conductive portion 60a of the neighboring current path 5b. As described above, since the magnetoelectric conversion elements 2a and 2b are arranged outside a region along a normal to a plane extending in the Y direction from the first conductive portion 60a of the neighboring current path 5b, and the magnetoelectric conversion elements 21a and 21b are arranged outside the region along the normal to a plane extending in the Y direction from the first conductive portion 58a of the first current path 5a, the measurement accuracy can be increased without an increase in size of the current sensor 108.

SECOND CONFIGURATION EXAMPLE

Figure 7:
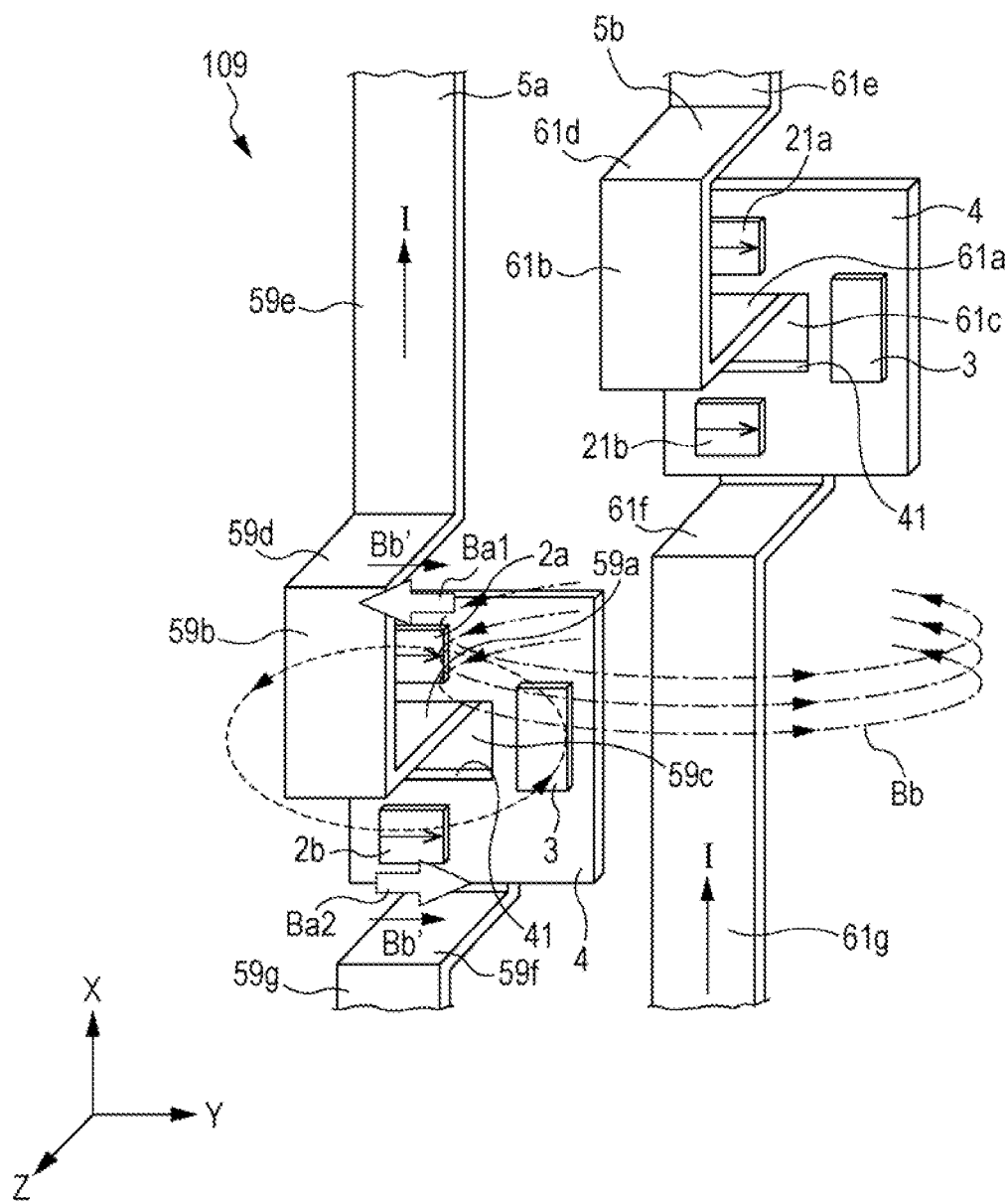
FIG. 7 illustrates a second configuration example of a current sensor.

FIG. 7 illustrates a configuration example of a current sensor according to the embodiment. Referring to FIG. 7, in a current sensor 109, a measurement-subject current path 5a and a neighboring current path 5b are provided to extend in the X direction in FIG. 7 in parallel to each other. Measurement-subject current flows through the measurement-subject current path 5a, and neighboring current flows through the neighboring current path 5b. Hence, the extending directions of the current paths 5a and 5b are the flowing directions. That is, the current path 5a extends in the flowing direction (a first direction), and the current path 5b is arranged next to the current path 5a in substantially parallel to the extending direction of the current path 5a.

A portion of the measurement-subject current path 5a is bent, and a plurality of bent conductive portions are formed. To be specific, in the configuration illustrated in FIG. 7, the current path 5a is formed in a substantially S shape. Surfaces of bent first conductive portion 59a, fourth conductive portion 59d, and sixth conductive portion 59f are oriented, for example, in a direction orthogonal to the flowing direction. Hence, the current path 5a is formed such that a second conductive portion 59b and a third conductive portion 59c extend in the X direction from both ends of the first conductive portion 59a and are connected at both the ends. Further, the fourth conductive portion 59d and a fifth conductive portion 59e are connected at the second conductive portion 59b. Also, the sixth conductive portion 59f and a seventh conductive portion 59g are connected at the third conductive portion 59c. The seventh conductive portion 59g is arranged on an extension of the fifth conductive portion 59e.

Similarly, a portion of the neighboring current path 5b is bent, and a plurality of bent conductive portions are formed. To be specific, in the configuration illustrated in FIG. 7, the current path 5b is formed in a substantially S shape (a crank shape). Surfaces of bent first conductive portion 61a, fourth conductive portion 61d, and sixth conductive portion 61f are oriented, for example, in a direction orthogonal to the flowing direction. Hence, the current path 5b is formed such that a second conductive portion 61b and a third conductive portion 61c extend in the X direction from both ends of the first conductive portion 61a and are connected at both the ends. Further, the fourth conductive portion 61d and a fifth conductive portion 61e are connected at the second conductive portion 61b. Also, the sixth conductive portion 61f and a seventh conductive portion 61g are connected at the third conductive portion 61c. The seventh conductive portion 61g is arranged on an extension of the fifth conductive portion 61e.

Magnetoelectric conversion elements 2a and 2b and a signal processing circuit 3 are mounted on a surface of a printed circuit board 4. The magnetoelectric conversion elements 2a and 2b are arranged with the first conductive portion 59a of the measurement-subject current path 5a interposed therebetween. Also, the magnetoelectric conversion element 2a is arranged between the first conductive portion 59a and the fourth conductive portion 59d, and the magnetoelectric conversion element 2b is arranged between the first conductive portion 59a and the sixth conductive portion 59f. Also, the directions of sensitive axes of the magnetoelectric conversion elements 2a and 2b are the Y direction.

The seventh conductive portion 61g of the neighboring current path 5b is arranged in the Y direction with respect to the magnetoelectric conversion elements 2a and 2b. The seventh conductive portion 61g is arranged so that the perpendicular line extending from the center line of the seventh conductive portion 61g of the neighboring current path 5b to the magnetoelectric conversion element 2a and the perpendicular line extending from the center line to the magnetoelectric conversion element 2b have substantially the same directions and substantially equivalent lengths.

To be specific, the printed circuit board 4 has two slits 41 penetrating therethrough from the near side to the far side of the figure (in the Z direction in FIG. 7). The printed circuit board 4 is arranged so that the first conductive portion 59a of the measurement-subject current path 5a passes through one of the slits 41. Hence, the magnetoelectric conversion elements 2a and 2b are arranged with the slit 41 interposed therebetween. Similarly, the printed circuit board 4 is arranged so that the first conductive portion 61a of the neighboring current path 5b passes through the other of the slits 41. Accordingly, magnetoelectric conversion elements 21a and 21b are arranged at substantially equivalent distances from the neighboring current path 5b with the slit 41 interposed therebetween.

The magnetoelectric conversion elements 2a and 2b are arranged so that the sensitive axes are perpendicular to the flowing directions and the sensitive axes are oriented in the same direction. In FIG. 7, arrows on the magnetoelectric conversion elements 2a and 2b indicate sensitive-axis directions of the respective magnetoelectric conversion elements. The first conductive portions 59a and 61a are formed at positions so as not to overlap each other (the first conductive portions are at mutually different positions in the X direction in FIG. 7).

With the current sensor 109 with this configuration, a case is considered such that current flows through the measurement-subject current path 5a and the neighboring current path 5b. In FIG. 7, it is assumed that current I flows upward of the figure (in the X direction in FIG. 7). The direction of an induced magnetic field Ba generated by current flowing through a portion of the first conductive portion 59a of the measurement-subject current path 5a inserted into the slit 41 (an induced magnetic field generated by current flowing through the fourth conductive portion 59d and the sixth conductive portion 59f) near the magnetoelectric conversion element 2a is opposite to that near the magnetoelectric conversion element 2b. Hence, an induced magnetic field Ba1 detected by the magnetoelectric conversion element 2a and an induced magnetic field Ba2 detected by the magnetoelectric conversion element 2b have the same strength and different directions. That is, the magnetic field generated by the current flowing through the measurement-subject current path 5a is applied with different vectors to the magnetoelectric conversion elements 2a and 2b.

In contrast, a magnetic field Bb is generated near the measurement-subject current path 5a by the current flowing through the neighboring current path 5b. A portion of the neighboring current path 5b next to the magnetoelectric conversion elements 2a and 2b is a straight region without the first conductive portion 61a. Accordingly, a magnetic field Bb' detected by the magnetoelectric conversion element 2a and a magnetic field Bb' detected by the magnetoelectric conversion element 2b have the same direction and the same strength. That is, the magnetic field generated by the current flowing through the neighboring current path 5b is applied with the same vector to the magnetoelectric conversion elements 2a and 2b. Also, geomagnetism is applied to the magnetoelectric conversion elements 2a and 2b with the same vector.

Hence, if the signal processing circuit 3 executes the differential operation processing for the magnetic field detected by the magnetoelectric conversion elements 2a and 2b, the effect of the external magnetic field with the same vector amount (the magnetic field Bb by the neighboring current path 5b and geomagnetism) are canceled, and only the induced magnetic field Ba by the measurement-subject current path 5a with the different vector amount is output as the difference. The current flowing through the measurement-subject current path 5a can be detected with high accuracy based on the induced magnetic field Ba output in this way.

As described above, in the current sensor 109, the magnetoelectric conversion elements 2a and 2b are arranged at both sides with the measurement-subject current path 5a interposed therebetween. Accordingly, the induced magnetic field Ba generated by the current flowing through the measurement-subject current path 5a is applied to the magnetoelectric conversion elements 2a and 2b with the different vectors, and the external magnetic field is applied to the magnetoelectric conversion elements 2a and 2b with the same vector. In this case, since the magnetic field generated at the measurement-subject current path 5a is applied to the magnetoelectric conversion elements 2a and 2b with the exactly opposite vectors, the difference output value can be increased, and the detection accuracy for the measurement-subject current can be increased. Also, the magnetic field generated by the current flowing through the seventh conductive portion 61g of the neighboring current path 5b is almost not measured by the magnetoelectric conversion elements 2a and 2b. Accordingly, the dynamic range can be prevented from being decreased.

The first conductive portions 59a and 61a may be perpendicular to the flowing direction, or may be provided at an angle (obliquely) to the flowing direction. Similarly to the first configuration example, if the first conductive portion 59a is oblique to the flowing direction, the range that the neighboring current path 5b is affected by the induced magnetic field Ba can be decreased as compared with that the first conductive portion 59a is perpendicular to the flowing direction.

OTHER CONFIGURATION EXAMPLE

The current sensor according to the embodiment is not limited to the configuration described in the above-described first and second configuration examples. For example, configurations illustrated in FIGS. 8 and 9 may be used.

Figure 8:
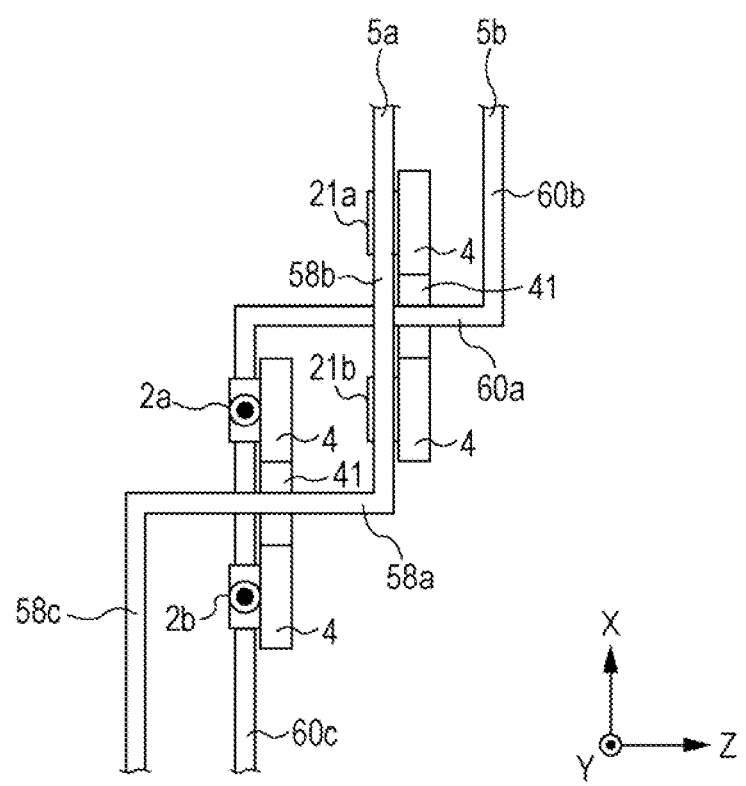
FIG. 8 illustrates other configuration example of a current sensor.

FIG. 8 illustrates a case where the positions in the height direction (the Z direction) of the measurement-subject current path 5a and the neighboring current path 5b are shifted from the configuration illustrated in FIG. 4B. With the configuration of FIG. 8, the induced magnetic field of the measurement-subject current path 5a can be orthogonal to the induced magnetic field of the neighboring current path 5b. Accordingly, the effect of the induced magnetic field of the neighboring current path 5b can be reduced for the magnetoelectric conversion elements 2a and 2b.

Figure 9:
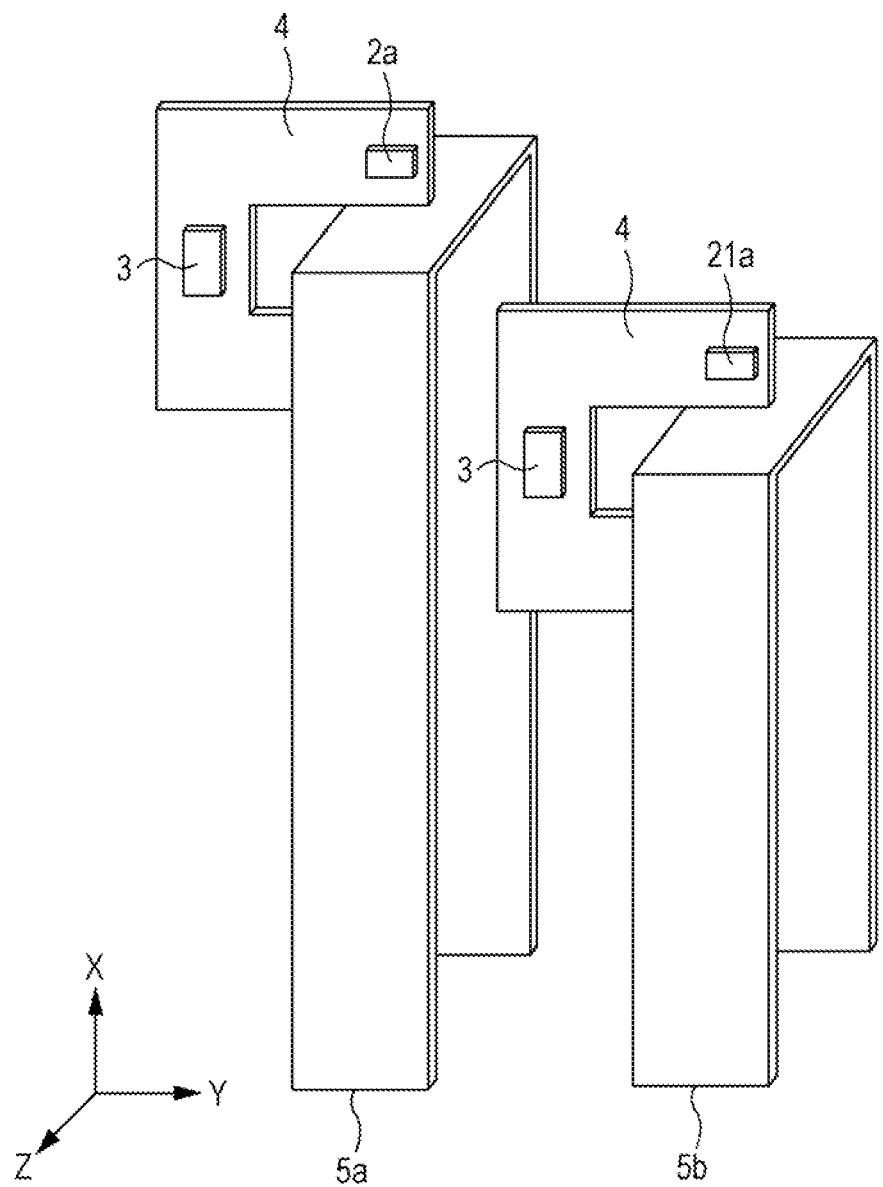
FIG. 9 illustrates other configuration example of a current sensor.

FIG. 9 illustrates a configuration that a measurement-subject current path 5a and a neighboring current path 5b each have a folded-back shape (a U shape). In this way, in the current sensor of this embodiment, the shape of the current path can be appropriately changed.

As described above, with each of the configuration examples of the current sensors, when the measurement-subject current path 5a and the neighboring current path 5b are provided in parallel to the flowing direction, the magnetic field Bb generated by the current flowing through the neighboring current path 5b is applied to the magnetoelectric conversion elements 2a and 2b provided at the measurement-subject current path 5a with the same vector, and the magnetic field Ba generated by the current flowing through the measurement-subject current path 5a is applied to the magnetoelectric conversion elements 2a and 2b with the different vectors. Accordingly, measurement accuracy for the measurement-subject current because of the effect of the magnetic field Bb of the neighboring current path 5b can be prevented from being decreased without position accuracy and mounting accuracy of the magnetoelectric conversion elements 2a and 2b being demanded.

The invention is not limited to the above-described embodiment, and may be implemented with various modifications. In the above-described embodiment, the accompanying drawings provide the sizes and shapes; however, the sizes and shapes are not limited thereto, and may be appropriately changed within the range that the advantages of the invention are exhibited. Also, configurations may be appropriately changed and implemented within the scope of the invention.

The current sensor of the invention may be used, for example, for detecting the magnitude of current for driving a motor of an electric vehicle or a hybrid car.

What is claimed is:

1. A current sensor comprising:
   a first current path serving as a measurement-subject current path;
   a second current path provided in a vicinity of the first current path; and
   wherein each of the first and second current paths includes:
      a first conductive portion;
      a second conductive portion extending along an X direction from one end of the first conductive portion; and
      a third conductive portion extending along the X direction from another end of the first conductive portion,
   wherein the first and second current paths are apart in a Y direction orthogonal to the X direction,
   wherein the second and third conductive portions of the first current path are apart from each other in a Z direction and aligned with each other in the Y direction, the Z direction being orthogonal to the X and Y directions,
   wherein the second and third conductive portions of the second current path are apart from each other in the Z direction, and aligned with each other in the Y direction,
   wherein the current sensor further comprises first and second magnetoelectric conversion elements arranged with the first conductive portion of the first current path interposed therebetween, the first and second magnetoelectric conversion elements having a respective sensitive axis along the Y direction,
   wherein the second conductive portion of the second current path is arranged on one side of the first and second magnetoelectric conversion elements in the Y direction, and
   wherein a perpendicular line from a center line of the second conductive portion of the second current path to the first magnetoelectric conversion element and a perpendicular line from the center line of the second conductive portion of the second current path to the second magnetoelectric conversion element have a same direction and a same length.

2. The current sensor according to claim 1,
   wherein the first and second conductive portions form a right angle, and
   wherein the first and third conductive portions form a right angle.

3. The current sensor according to claim 1, wherein the first and second magnetoelectric conversion elements are arranged by avoiding a region along a plane normal to and intersecting with the first conductive portion of the second current path, the plane extending in the Y direction.

4. The current sensor according to claim 3,
   wherein the second conductive portion of the first current path, the third conductive portion of the first current path, the second conductive portion of the second current path, and the third conductive portion of the second current path are parallel to one another,
   wherein the first and second conductive portions in each of the first and second current paths form an angle other than a right angle, and
   wherein the first and third conductive portions in each of the first and second current paths form an angle other than a right angle.

5. The current sensor according to claim 1, further comprising:
fourth and fifth conductive portions connected to the second conductive portion of the first current path; and
sixth and seventh conductive portions connected to the third conductive portion of the first current path,
wherein the seventh conductive portion is provided on an extended line of the fifth conductive portion.

6. The current sensor according to claim 1,
wherein the first conductive portion of the first current path has a length in the Y direction greater than a length thereof in the X direction, and
wherein each of the second and third conductive portions of the first current path has a length in the Y direction greater than a length thereof in the Z direction.

7. The current sensor according to claim 6, further comprising:
a substrate on which the first and second magnetoelectric conversion elements are mounted,
wherein the substrate has a first slit formed between the first and second magnetoelectric conversion elements, and the first conductive portion of the first current path is arranged at the first slit.

8. The current sensor according to claim 7, further comprising:
third and fourth magnetoelectric conversion elements mounted on the substrate such that the first conductive portion of the second current path is interposed therebetween,
wherein the substrate has a second slit formed between the third and fourth magnetoelectric conversion elements, and the first conductive portion of the second current path is arranged at the second slit.

* * * * *